US008409712B2

(12) United States Patent
Yokoyama et al.

(10) Patent No.: US 8,409,712 B2
(45) Date of Patent: Apr. 2, 2013

(54) ALLOY TO BE SURFACE-COATED AND SLIDING MEMBERS

(75) Inventors: Kenji Yokoyama, Yasugi (JP);
Kunichika Kubota, Yasugi (JP);
Toshihiro Uehara, Yasugi (JP);
Takehiro Ohno, Yasugi (JP); Katsuhiko Ohishi, Yasugi (JP)

(73) Assignee: Hitachi Metals Ltd., Tokyo (JP)

( * ) Notice: Subject to any disclaimer, the term of this patent is extended or adjusted under 35 U.S.C. 154(b) by 286 days.

(21) Appl. No.: 12/863,127

(22) PCT Filed: Jan. 16, 2009

(86) PCT No.: PCT/JP2009/050532
§ 371 (c)(1),
(2), (4) Date: Jul. 15, 2010

(87) PCT Pub. No.: WO2009/093527
PCT Pub. Date: Jul. 30, 2009

(65) Prior Publication Data
US 2010/0291407 A1     Nov. 18, 2010

(30) Foreign Application Priority Data
Jan. 21, 2008  (JP) ................................. 2008-010522

(51) Int. Cl.
*B32B 9/00*     (2006.01)
(52) U.S. Cl. .......................... 428/408; 148/321; 420/111
(58) Field of Classification Search .................. 420/111; 148/321; 428/408
See application file for complete search history.

(56) References Cited

U.S. PATENT DOCUMENTS

| 3,660,174 | A | * | 5/1972 | Jakenberg | 148/608 |
|---|---|---|---|---|---|
| 4,966,751 | A | * | 10/1990 | Kaede et al. | 420/34 |
| 5,998,042 | A | * | 12/1999 | Tanaka et al. | 428/627 |
| 6,994,474 | B2 | * | 2/2006 | Kinno et al. | 384/492 |
| 7,270,719 | B2 | * | 9/2007 | Berglund | 148/225 |
| 7,297,177 | B2 | * | 11/2007 | Sandberg et al. | 75/246 |
| 2003/0156965 | A1 | * | 8/2003 | Ernst et al. | 420/12 |
| 2005/0252580 | A1 | | 11/2005 | Shimizu et al. | |

FOREIGN PATENT DOCUMENTS

| CN | 1735699 A | 2/2006 |
|---|---|---|
| JP | 59-74263 A | 4/1984 |
| JP | 9-78199 A | 3/1997 |
| JP | 9-316601 A | 12/1997 |

(Continued)

OTHER PUBLICATIONS

Korean Office Action dated Mar. 16, 2012.

(Continued)

*Primary Examiner* — Archene Turner
(74) *Attorney, Agent, or Firm* — Sughrue Mion, PLLC

(57) ABSTRACT

An alloy to be surface-coated, which can keep excellent hardness of 58HRC or above even when the amount of an alloying element added is reduced or even when the alloy is heated to a temperature of as high as 400 to 500° C.; and sliding members produced by forming a hard film on the surface of the alloy. An alloy to be surface-coated, the surface of which is to be covered with a hard film, which alloy contains by mass C: 0.5 to 1.2%, Si: 2.0% or below, Mn: 1.0% or below, Cr: 5.0 to 14.0%, Mo+1/2 W: 0.5 to 5.0%, and N: more than 0.015 to 0.1% with the balance being Fe and impurities, preferably such an alloy which contains by mass C: 0.6 to 0.85%, Si: 0.1 to 1.5%, Mn: 0.2 to 0.8%, Cr: 7.0 to 11.0%, Mo+1/2 W: 1.0 to 4.0%, and N: 0.04 to 0.08%.

5 Claims, 1 Drawing Sheet

500 μm

FOREIGN PATENT DOCUMENTS

| | | |
|---|---|---|
| JP | 2000-290753 A | 10/2000 |
| JP | 2003-027236 A | 1/2003 |
| JP | 2005-187900 A | 7/2005 |
| JP | 2005-290517 A | 10/2005 |
| JP | 2005-325407 A | 11/2005 |
| JP | 2006-322042 A | 11/2006 |
| KR | 1020070049955 | 5/2007 |
| WO | 2004/063399 A1 | 7/2004 |

OTHER PUBLICATIONS

Chinese Office Action issued in Application No. 200980102615.2 dated Feb. 21, 2012.

Masaya Takahashi, et al., "Influence of Substrate Hardness on Adhesion Strength of DLC Film," Surface Finishing Society of Japan, Summary of the 105th Meeting, Mar. 4, 2002, p. 199, vol. 105.

* cited by examiner

500 μm

500 μm

ALLOY TO BE SURFACE-COATED AND SLIDING MEMBERS

CROSS REFERENCE TO RELATED APPLICATIONS

This application is a National Stage of International Application No. PCT/JP2009/050532 filed Jan. 16, 2009, claiming priority from Japanese Patent Application No. 2008-010522, filed Jan. 21, 2008, the contents of all of which are incorporated herein by reference in their entirety.

TECHNICAL FIELD

The present invention relates to an alloy to be surface-coated with a hard film, and to a sliding member produced by coating a hard film on the surface of the alloy.

BACKGROUND OF THE INVENTION

A material where, for example, a DLC (Diamond like Carbon) or a ceramic hard film is coated on the surface of a metal member can have improved properties such as abrasion resistance or slidability. Therefore, the material is applied to a member used in a severe environment. Among them, a sliding member coated with a DLC film has been widely used since it is excellent in abrasion resistance and slidability.

However, when a DLC film, for example, is formed on an alloy to be surface-coated through a P-CVD (plasma CVD) or PVD process, there is a problem in adhesion. In order to improve adhesive strength, the substrate needs to be heated to a high temperature during depositing the film. That is, the alloy to be surface-coated is heated to a high temperature of 400 to 500° C. If the material softens during heating, the DLC film will be easily released. Therefore, it is necessary to select an alloy to be surface-coated which is hardly softened even at a high temperature of 500° C.

Therefore, a high speed tool steel which is not softened to 58HRC or less even at high temperatures is preferably used as an alloy on which a DLC film is coated using the P-CVD (plasma CVD) or PVD process (see JP-A-2003-27236). The high speed tool steel contains a large amount of alloying element such as Mo, W, V, or Nb. Due to these alloying elements, the steel can maintain its hardness at a high value even during forming a DLC film through the P-CVD (plasma CVD) or PVD process, for example.
[PATENT DOCUMENT 1] JP-A-2003-27236

SUMMARY OF THE INVENTION

Problems to be Solved by the Invention

The alloy to be surface-coated made of a high speed tool steel contains a large amount of expensive alloying elements. Recently, cost of the alloying elements has been significantly increasing. Therefore, in order to produce an inexpensive alloy to be surface-coated, there is required an alloy to be surface-coated in which desired properties are obtained even when the kinds of alloying elements to be added is decreased or the amount of alloying elements to be added is reduced.

However, for example, a low-alloy steel, such as JIS SUP12 or JIS SUJ2, softens to a hardness of less than 58HRC by heating to a high temperature of 500° C., and a DLC film is easily released. Therefore, such a low-alloy steel is not suitable as an alloy to be surface-coated.

An object of the present invention is to provide an alloy to be surface-coated, which can maintain excellent hardness of not lower than 58HRC even when the amount of an alloying element added is reduced as compared with the high speed tool steel and even when the alloy is heated to a high temperature of 400 to 500° C. Also, an object of the present invention is to provide a sliding member in which a hard film is coated on the surface of the alloy.

Means for Solving the Problems

The present invention is made in view of the problems mentioned above.

The present invention provides an alloy to be surface-coated with a hard film. The alloy comprises, by mass, C: 0.5 to 1.2%, Si: not more than 2.0%, Mn: not more than 1.0%, Cr: 5.0 to 14.0%, Mo+1/2 W: 0.5 to 5.0%, and N: more than 0.015 but not more than 0.1%, and the balance being Fe and impurities.

Preferably, the alloy may contain, by mass, C: 0.6 to 0.85%, Si: 0.1 to 1.5%, Mn: 0.2 to 0.8%, Cr: 7.0 to 11.0%, Mo+1/2 W: 1.0 to 4.0%, and N: 0.04 to 0.08%.

The alloy may further contain, by mass, at least one of S: not more than 0.1%, Ca: not more than 0.1%, and Mg: not more than 0.03%.

In addition, the alloy may further contain, by mass, at least one of V: not more than 1.0%, Cu: not more than 0.5%, and Nb: not more than 0.3%.

Moreover, a hard film coated on a surface of the alloy may be a DLC film.

Moreover, the present invention provides a sliding member in which a hard film is coated on the surface of the alloy to be surface-coated.

Preferably, there may be provided a sliding member in which the hard film is a DLC film.

Advantages of the Invention

The alloy to be surface-coated of the present invention is suitable as a material for a sliding member, on which a hard film is coated, because the alloy can keep excellent hardness of not less than 58HRC even when the amount of an alloying element to be added is reduced as compared with a high speed tool steel and even when the alloy is heated to a high temperature of 400 to 500° C.

DETAILED DESCRIPTION OF THE INVENTION

Figure 1:
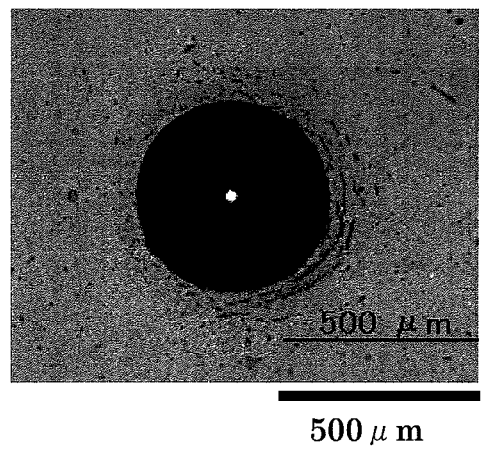
FIG. 1 is micrograph of an appearance of a sliding member subjected to an adhesion evaluation test, where a DLC film is coated on the alloy to be surface-coated according to the present invention.

As described above, the important feature of the present invention resides in the alloy composition that allows excellent hardness of not lower than 58HRC to be kept even when the amount of an alloying element is reduced as compared with a high speed tool steel and even when the alloy is heated to a high temperature of 400 to 500° C. The present invention will be described in detail below. Note that, unless otherwise stated, the content of each element is expressed by mass percent.

C: 0.5 to 1.2%

C is essentially contained in the alloy to be surface-coated because it is an important element for increasing the hardness of the matrix of the alloy and ensuring the abrasion resistance of the alloy by forming a carbide with Cr or Mo through high-temperature tempering.

However, if C is contained in excess of 1.2%, the toughness of the alloy will be reduced. If the content is less than 0.5%, the effect of adding C as described above will not be obtained. Therefore, the content of C is limited to the range of 0.5 to 1.2%. Preferably, the content of C is limited to the range of 0.6 to 0.85% for ensuring the effect as described above. More preferably, the lower limit of the C content is 0.6%, and the upper limit of the C content is 0.7%.

Si: not more than 2.0%

Si is essentially added to the alloy to be surface-coated in the range of not more than 2.0%. It is added as a deoxidizing element as well for increasing the hardness after high-temperature tempering in the present invention. Even if Si is added in excess of 2.0%, the effect of increasing the hardness after high-temperature tempering cannot be expected to be increased, but on the contrary an excessive Si content deteriorates toughness and hot workability. Therefore, the content of Si is defined in the range of not more than 2.0%.

The preferable content of Si for ensuring its effect of increasing the hardness after high-temperature tempering is in the range of 0.1 to 1.5%. More preferably, the lower limit of the Si content is 0.3%, further more preferably 0.5%, and the upper limit of the Si content is 1.3%, further more preferably 1.1%.

Mn: not more than 1.0%

Mn can increase the strength of a steel without reducing toughness, and it also improves the hardness after high-temperature tempering. However, an excessive Mn content reduces workability and low-temperature toughness. In addition, the resulting material is liable to undergo work hardening, and during working, the material is increased in the elastic limit, yield strength, tensile strength, fatigue limit and the like and decreased in elongation and reduction of area. When Mn is added in excess of 1.0%, the resulting steel will become brittle during tempering. Therefore, the upper limit of the Mn content is defined to be not more than 1.0%. The lower limit of the Mn content that ensures the strength of the steel and can more positively suppress reduction in workability and embrittlement during tempering is preferably 0.2%, more preferably 0.3%, further more preferably 0.6%. Preferred upper limit of the Mn content is 0.8%.

Cr: 5.0 to 14.0%

Cr is essentially added to the alloy to be surface-coated in an amount of at least 5.0% because it has an effect of improving hardenability and increasing the hardness after high-temperature tempering. The upper limit of the Cr content is defined to be 14% because addition of excessive Cr has an adverse effect on workability and low-temperature toughness while Cr is effective in improving corrosion resistance. The hardness after high-temperature tempering does not necessarily increase depending on the increase in the Cr content, and the hardness is the highest at a suitable Cr content. For ensuring this effect, the lower limit of the Cr content is 7.0%, preferably 8.0%, and the upper limit is preferably 11.0%.

Mo+1/2 W: 0.5 to 5.0%

Mo and W may be added singly or in combination for increasing softening resistance after high-temperature tempering and improving abrasion resistance and thermal fatigue resistance by solid solution strengthening and/or carbide precipitation hardening. In addition, Mo and W improve hardness by making a hard carbide.

Since W has an atomic weight about twice that of Mo, the contents of these elements are defined as Mo+1/2 W (naturally, only one of them or both of them may be added). The lower limit of Mo+1/2 W is defined to be 0.5% because an improvement in the hardness after high-temperature tempering is not obtained if the content of Mo and W is lower. However, the above effect cannot be expected to be increased even if the amount of Mo+1/2 W added exceeds 5.0%. Therefore, the upper limit of the content of Mo+1/2 W is defined to be 5.0%. The lower limit of the content of Mo+1/2 W is preferably 1.0%, and the upper limit of the content of Mo+1/2 W is preferably 4.0%, more preferably 3.0%.

N: more than 0.015 but not more than 0.1%

Addition of N causes solid solution strengthening, precipitation hardening and/or decrease in the size of carbide, thereby increasing hardness. In addition, N is an effective component for improving the hardness after high-temperature tempering and creep properties. However, since an excessive addition of N reduces workability and low-temperature toughness, the upper limit of the N content is defined to be 0.1%. On the other hand, if the N content is excessively reduced, the effect of causing solid solution strengthening, precipitation hardening and/or decrease in the grain size to thereby increase hardness will not obtained. Therefore, the lower limit of the N content is defined in the range of more than 0.015%. In order to ensure the hardness after high-temperature tempering, the lower limit of the N content is preferably 0.04%, and the upper limit of the N content is preferably 0.08%.

In the present invention, an element other than those as described above is substantially Fe, but elements incidentally mixed during a production process are naturally contained in the alloy to be surface-coated.

Moreover, in addition to the elements as described above, at least one of the following elements can be added as a optional element: V in the range of not more than 1.0%, which has an effect of increasing softening resistance and improving properties such as hardness, strength, and toughness; Cu in the range of not more than 0.5%, which has an effect of improving properties such as corrosion resistance; and Nb in the range of not more than 0.3%, which has an effect of preventing grain coarsening during high-temperature tempering.

Further, S may be contained in the alloy to be surface-coated in an amount in the range of not more than 0.1%, which improves machinability by forming a sulfide with essentially added element Mn or the like. Particularly, when a very small amount of S is added, it forms a sulfide with Mn or the like, thereby improving machinability. Therefore, a very small amount of S can be optionally added. On the other hand, if a large amount of S is added, it will give an adverse effect on hot workability, weld hot cracking resistance, and corrosion resistance. Therefore, the content of S is defined to be not more than 0.1%. For improving machinability, the lower limit of the S content is preferably 0.03%, and the upper limit of the S content is preferably 0.08%.

Furthermore, Ca and Mg, which improve machinability similar to S, can be added in an amount in the range of not more than 0.1% and not more than 0.03%, respectively.

S, Ca, and Mg can also be added in combination.

The alloy to be surface-coated can keep excellent hardness of not lower than 58HRC even when the alloy is heated to a high temperature of 400 to 500° C. Therefore, the alloy is most suitable as a material for the P-CVD (plasma CVD) or PVD process in which a hard film for improving slidability is formed while enhancing the adhesion of the hard film by heating the alloy to a high temperature of 400 to 500° C.

The P-CVD (plasma CVD) or PVD process can coat a hard film of TiN, TiC, Al₂O₃, DLC, or the like. Among them, when a DLC film is formed so that it has an improved adhesion, the alloy to be surface-coated may be heated at about 400 to 500° C., and the resulting DLC film can impart excellent slidability. Therefore, the alloy to be surface-coated of the present invention is suitable as a material on which the DLC film having good adhesion is coated through the P-CVD (plasma CVD) or PVD process. As a sliding member, the combination of the alloy to be surface-coated of the present invention and a DLC film is most suitable and particularly preferred.

EXAMPLES

The present invention will be described in more detail by the following Examples.

Steel ingots having a weight of 10 kg were produced through vacuum melting to obtain alloys to be surface-coated of the present invention and Comparative Examples, each having the chemical composition shown in Table 1. The chemical compositions of the produced alloys are shown in Table 1.

Note that the alloys No. 21 and No. 22 of the present invention were subjected to 3-ton melting (air melting).

The produced alloys to be surface-coated were subjected to homogenizing annealing followed by hot forging at 1150° C. to obtain forged alloys having a size of 15 mm (T)×15 mm (W)×1000 mm (L).

The forged alloys were then annealed at 780° C. for 3 hours. Then, test pieces for measuring hardness each having a size of 15 mm (T)×15 mm (W)×15 mm (L) were produced from the annealed alloys.

The alloys of No. 21 and No. 22 were subjected to hot forging after air melting, and the forged alloys were each hot rolled into a rod of 14 mm in diameter followed by annealing at 860° C. for 3 hours. Then, test pieces for measuring hardness each having a thickness of 15 mm were obtained from the annealed alloys.

These test pieces were heated and held at temperatures shown in Tables 2 and 3 in an air furnace and then quenched in oil. After quenching, both surfaces of the test pieces were polished in parallel. The polished test pieces were tempered at about 500° C., which is near the upper limit of DLC film forming temperature. Tempering temperatures are shown in Tables 2 and 3. The tempered test pieces were measured for the Rockwell C scale hardness. The results are shown in Tables 2 and 3.

TABLE 1

(mass %)

| No | C | Si | Mn | Cr | Mo and/or W | N | S | Ca | Mg | V | Nb | Cu | Remarks |
|---|---|---|---|---|---|---|---|---|---|---|---|---|---|
| 1 | 0.66 | 1.01 | 0.70 | 11.52 | Mo: 1.99 | 0.05 | 0.003 | — | — | — | — | — | The present invention |
| 2 | 0.67 | 1.00 | 0.71 | 9.84 | Mo: 2.04 | 0.05 | 0.003 | — | — | — | — | — | The present invention |
| 3 | 0.66 | 1.01 | 0.70 | 8.03 | Mo: 2.00 | 0.04 | 0.003 | — | — | — | — | — | The present invention |
| 4 | 0.66 | 0.98 | 0.69 | 6.35 | Mo: 1.97 | 0.03 | 0.003 | — | — | — | — | — | The present invention |
| 5 | 0.66 | 1.03 | 0.70 | 12.10 | Mo: 1.02 W: 2.14 | 0.07 | 0.003 | — | — | — | — | — | The present invention |
| 6 | 0.66 | 1.02 | 0.69 | 12.02 | W: 3.94 | 0.06 | 0.003 | — | — | — | — | — | The present invention |
| 7 | 0.66 | 1.01 | 0.70 | 12.31 | Mo: 1.98 W: 0.01 | 0.08 | 0.003 | — | — | — | — | — | The present invention |
| 8 | 0.66 | 1.43 | 0.32 | 11.97 | Mo: 2.03 W: 0.01 | 0.06 | 0.004 | — | — | — | — | — | The present invention |
| 9 | 0.64 | 0.99 | 0.69 | 13.29 | Mo: 1.96 | 0.07 | 0.002 | — | — | — | — | — | The present invention |
| 10 | 0.66 | 1.02 | 0.32 | 10.03 | Mo: 1.98 | 0.04 | 0.082 | — | — | — | — | — | The present invention |
| 11 | 0.66 | 1.02 | 0.30 | 9.94 | Mo: 1.99 | 0.04 | 0.046 | — | — | — | — | — | The present invention |
| 12 | 0.66 | 1.03 | 0.32 | 9.77 | Mo: 1.99 | 0.05 | 0.012 | — | — | — | — | — | The present invention |
| 13 | 0.67 | 1.02 | 0.33 | 9.81 | Mo: 2.02 | 0.04 | 0.046 | — | 0.005 | — | — | — | The present invention |
| 14 | 0.65 | 1.01 | 0.32 | 9.58 | Mo: 1.96 | 0.04 | 0.035 | 0.006 | — | — | — | — | The present invention |
| 15 | 0.63 | 0.98 | 0.30 | 9.80 | Mo: 1.91 | 0.03 | 0.037 | 0.002 | 0.003 | — | — | — | The present invention |
| 16 | 0.65 | 0.99 | 0.72 | 12.30 | Mo: 2.94 | 0.06 | — | — | — | — | — | — | The present invention |
| 17 | 0.65 | 0.99 | 0.72 | 12.32 | Mo: 1.98 | 0.06 | — | — | — | — | 0.22 | — | The present invention |
| 18 | 0.67 | 1.01 | 0.74 | 12.29 | Mo: 2.00 | 0.06 | — | — | — | 0.45 | — | — | The present invention |
| 19 | 0.66 | 0.99 | 0.68 | 12.16 | Mo: 1.96 W: 0.45 | 0.05 | — | — | — | — | — | — | The present invention |
| 20 | 0.72 | 1.21 | 0.71 | 12.15 | Mo: 0.50 W: 0.26 | 0.07 | — | — | — | 0.26 | — | — | The present invention |
| 21 | 0.67 | 0.99 | 0.70 | 10.01 | Mo: 2.01 | 0.04 | — | — | — | — | — | 0.02 | The present invention |
| 22 | 0.66 | 1.01 | 0.68 | 10.00 | Mo: 2.01 | 0.05 | 0.002 | — | — | — | — | 0.02 | The present invention |
| 23 | 0.66 | 1.01 | 0.66 | 9.03 | Mo: 2.00 | 0.04 | — | — | — | — | — | — | The present invention |
| 24 | 0.66 | 0.98 | 0.70 | 13.15 | — | — | 0.002 | — | — | — | — | — | Comparative Example |
| 25 | 0.67 | 1.01 | 0.71 | 13.79 | Mo: 1.97 | — | 0.002 | — | — | — | — | — | Comparative Example |
| 26 | 0.56 | 1.41 | 0.71 | 0.70 | — | — | — | — | — | — | — | — | Comparative Example SUP 12 |
| 27 | 1.03 | 0.25 | 0.25 | 1.45 | — | — | — | — | — | — | — | — | Comparative Example SUJ 2 |
| 28 | 0.85 | 0.25 | 0.35 | 4.20 | Mo: 8.55 | — | — | — | — | 2.00 | — | — | Comparative Example SKH51 |

*1: The balance other than the elements shown in Table 1 is Fe and incidental impurities.
*2: The symbol "—" in Table 1 means "not added".

TABLE 2

| No. | Quenching temperature | Tempering temperature | Hardness | Remarks |
|---|---|---|---|---|
| 1 | 1025° C. | 500° C. | 60.6HRC | The present invention |
| 1 | 1050° C. | 500° C. | 60.7HRC | The present invention |
| 1 | 1050° C. | 520° C. | 61.0HRC | The present invention |
| 1 | 1075° C. | 540° C. | 61.6HRC | The present invention |
| 2 | 1025° C. | 500° C. | 61.6HRC | The present invention |
| 2 | 1050° C. | 500° C. | 60.9HRC | The present invention |
| 2 | 1050° C. | 540° C. | 62.3HRC | The present invention |
| 2 | 1075° C. | 540° C. | 62.6HRC | The present invention |
| 3 | 1025° C. | 500° C. | 61.4HRC | The present invention |
| 3 | 1050° C. | 500° C. | 59.9HRC | The present invention |
| 3 | 1050° C. | 540° C. | 63.1HRC | The present invention |
| 3 | 1075° C. | 560° C. | 62.3HRC | The present invention |
| 4 | 1025° C. | 500° C. | 60.5HRC | The present invention |
| 4 | 1050° C. | 500° C. | 58.2HRC | The present invention |
| 4 | 1050° C. | 560° C. | 62.5HRC | The present invention |
| 4 | 1075° C. | 560° C. | 62.5HRC | The present invention |
| 5 | 1025° C. | 500° C. | 60.2HRC | The present invention |
| 5 | 1050° C. | 500° C. | 60.2HRC | The present invention |
| 5 | 1075° C. | 540° C. | 61.0HRC | The present invention |
| 6 | 1025° C. | 500° C. | 59.9HRC | The present invention |
| 6 | 1050° C. | 500° C. | 60.2HRC | The present invention |
| 6 | 1075° C. | 540° C. | 60.4HRC | The present invention |
| 7 | 1025° C. | 500° C. | 60.6HRC | The present invention |
| 7 | 1050° C. | 500° C. | 60.1HRC | The present invention |
| 7 | 1075° C. | 540° C. | 61.3HRC | The present invention |
| 8 | 1025° C. | 500° C. | 60.8HRC | The present invention |
| 8 | 1050° C. | 500° C. | 61.0HRC | The present invention |
| 8 | 1075° C. | 540° C. | 61.6HRC | The present invention |
| 9 | 1050° C. | 500° C. | 59.0HRC | The present invention |
| 10 | 1050° C. | 500° C. | 61.5HRC | The present invention |
| 11 | 1050° C. | 500° C. | 61.6HRC | The present invention |
| 12 | 1050° C. | 500° C. | 61.5HRC | The present invention |

TABLE 3

| No. | Quenching temperature | Tempering temperature | Hardness | Remarks |
|---|---|---|---|---|
| 13 | 1050° C. | 500° C. | 61.5HRC | The present invention |
| 14 | 1050° C. | 500° C. | 61.0HRC | The present invention |
| 15 | 1050° C. | 500° C. | 60.8HRC | The present invention |
| 16 | 1025° C. | 500° C. | 58.7HRC | The present invention |
| 16 | 1050° C. | 500° C. | 59.7HRC | The present invention |
| 16 | 1075° C. | 540° C. | 61.0HRC | The present invention |
| 17 | 1050° C. | 500° C. | 58.5HRC | The present invention |
| 17 | 1075° C. | 520° C. | 59.4HRC | The present invention |
| 18 | 1025° C. | 500° C. | 58.1HRC | The present invention |
| 18 | 1050° C. | 500° C. | 59.6HRC | The present invention |
| 18 | 1075° C. | 520° C. | 60.2HRC | The present invention |
| 19 | 1025° C. | 500° C. | 59.0HRC | The present invention |
| 19 | 1050° C. | 500° C. | 59.7HRC | The present invention |
| 19 | 1075° C. | 540° C. | 60.3HRC | The present invention |
| 20 | 1025° C. | 500° C. | 58.0HRC | The present invention |
| 20 | 1050° C. | 500° C. | 60.5HRC | The present invention |
| 20 | 1075° C. | 540° C. | 61.0HRC | The present invention |
| 21 | 1025° C. | 500° C. | 61.2HRC | The present invention |
| 21 | 1050° C. | 500° C. | 60.7HRC | The present invention |
| 21 | 1050° C. | 520° C. | 61.7HRC | The present invention |
| 21 | 1075° C. | 540° C. | 62.5HRC | The present invention |
| 22 | 1025° C. | 500° C. | 61.2HRC | The present invention |
| 22 | 1050° C. | 500° C. | 60.8HRC | The present invention |
| 22 | 1050° C. | 520° C. | 61.8HRC | The present invention |
| 22 | 1075° C. | 540° C. | 62.4HRC | The present invention |
| 24 | 1050° C. | 500° C. | 56.9HRC | Comparative Example |
| 25 | 1050° C. | 500° C. | 57.4HRC | Comparative Example |
| 26 | 950° C. | 500° C. | 44.3HRC | Comparative Example: SUP12 |
| 27 | 820° C. | 500° C. | 43.7HRC | Comparative Example: SUJ2 |
| 27 | 950° C. | 500° C. | 46.9HRC | Comparative Example: SUJ2 |
| 27 | 950° C. | 180° C. | 63.0HRC | Comparative Example: SUJ2 |
| 28 | 1200° C. | 500° C. | 65.5HRC | Comparative Example: SKH51 |

As shown in Tables 2 and 3, it is clear that the alloys to be surface-coated of the present invention each have a hardness of not lower than 58HRC after tempering at not lower than 500° C. although added alloying elements are reduced as compared with a high speed tool steel SKH51. On the other hand, the alloys in Comparative Examples No. 24 and No. 25 cannot obtain a hardness of not lower than 58HRC, and SUP12 and SUJ2 each have a hardness much lower than 58HRC after tempering at 500° C.

Note that SUJ2 has a hardness of 63HRC after tempering at 180° C., but has a reduced hardness of 47HRC or below after high-temperature tempering at 500° C. This means that the material has a reduced hardness when a material after low-temperature tempering at 180° C. is heated to about 500° C.

From the above, the alloy to be surface-coated of the present invention can be used as a sliding member because it can maintain high hardness even in a temperature range of about 500° C. which is the upper limit of the film forming temperature of the DLC film and high adhesion can be maintained when a hard film is formed on the surface of the alloy.

Next, the alloys Nos. 10, 11, 12, 13, 14 and 15 among the alloys of the present invention, to which a machinability-improving element has been added, were subjected to machinability test. In order to verify the machinability-improving effect, the alloy No. 23, to which a machinability-improving element is not added, was also subjected to machinability test.

In the machinability test, a test piece having a size of 15 mm (T)×15 mm (W)×22 mm (L) was cut out from an annealed alloy, and the cut test piece for machinability test was subjected to drilling working with a drill. The wear of the drill was evaluated. Test results of the evaluation are shown in Table 4, wherein "A" represents the outermost peripheral part of the drill, and "B" represents the 4/D part. Note that the test conditions are as follows:

Drill diameter: a straight shank drill having a diameter of 4.0 mm;
Cutting depth: 20 mm;
Cutting speed: 30 m/min;
Feeding speed: 0.05 mm/rev;
Step feed: 10 mm; and
Cutting fluid: water soluble.

TABLE 4

| | (mm) | |
|---|---|---|
| No | A | B |
| 10 | 0.07 | 0.03 |
| 11 | 0.08 | 0.03 |
| 12 | 0.05 | 0.02 |
| 13 | 0.09 | 0.03 |
| 14 | 0.03 | 0.02 |
| 15 | 0.05 | 0.03 |
| 23 | 0.10 | 0.03 |

As shown in Table 4, it is clear that the alloys of the present invention, to which a machinability-improving element is added, have a better machinability than the alloy No. 23 to which a machinability-improving element is not added. Especially, it is clear that the alloy No. 14 to which a suitable amount of S and Ca is added in combination has the best machinability.

Next, a DLC film was formed on the alloy No. 9 of the present invention, which are produced according to the chemical composition in Table 1, and on a low-alloy steel SUJ2. The resulting alloys each having a DLC film thereon were compared.

The alloy No. 9 of the present invention annealed at 780° C. for 3 hours was cut out to a size of 15 mm×15 mm×30 mm and heated to 1050° C. followed by quenching in oil followed by tempering at 500° C. The low-alloy steel SUJ2 was annealed at 780° C. for 3 hours, cut out to a size of 15 mm×15 mm×30 mm, and heated to 950° C. followed by quenching in oil followed by tempering at 180° C.

The quenched and tempered alloy was then cut out to a size of 10 mm in width×20 mm in length×3 mm in thickness and mirror-finished to produce a test piece of the alloy, on the surface of which a DLC film was then formed through the PVD process. It was confirmed that the test piece was heated to a maximum temperature of 424° C. during the formation of the DLC film.

After the DLC film was formed, the adhesion of the DLC film was evaluated utilizing the indentation by a Rockwell hardness-tester. Note that the evaluation of adhesion was performed using a load of 150 kgf and a diamond indenter. FIG. 1 shows an appearance photograph evaluating the alloy No. 9 of the present invention, and FIG. 2 shows an appearance photograph evaluating the low-alloy steel SUJ2.

Figure 2:
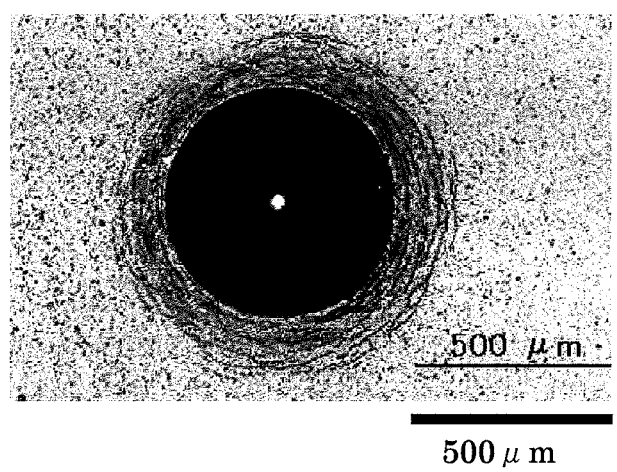
FIG. 2 is a micrograph of an appearance of a sliding member subjected to an adhesion evaluation test, where a DLC film is coated on JIS SUJ2.

As shown in FIGS. 1 and 2, the alloy of the present invention developed smaller cracks by the indentation as compared with the low-alloy steel SUJ2. Thus, it was verified that the alloy of the present invention maintains higher adhesion than SUJ2.

INDUSTRIAL APPLICABILITY

The alloy of the present invention can be applied to applications in which high hardness is indispensable during high-temperature heating. Furthermore, since the amount of an expensive alloy element can be decreased in the alloy of the present invention, the alloy is more economical than conventional alloys in which an expensive alloy element are used, and can be expected to find applications in a wider range.

The invention claimed is:

1. A sliding member, wherein a hard film is coated on a surface of an alloy comprising, by mass,
C: 0.6 to 0.7%
Si: not more than 2.0%,
Mn: not more than 1.0%,
Cr: 8.0 to 11.0%,
Mo+1/2 W: 0.5 to 5.0%,
N: more than 0.015% but not more than 0.1%, and
the balance being Fe and impurities.

2. The sliding member according to claim 1, wherein the hard film is a DLC film.

3. The sliding member according to claim 1, wherein the alloy contains, by mass,
C: 0.6 to 0.7%,
Si: 0.1 to 1.5%,
Mn: 0.2 to 0.8%,
Cr: 8.0 to 11.0%,
Mo+1/2 W: 1.0 to 4.0%, and
N: 0.04 to 0.08%.

4. The sliding member according to claim 1, wherein the alloy further contains, by mass, at least one of
S: not more than 0.1%,
Ca: not more than 0.1%, and
Mg: not more than 0.03%.

5. The sliding member according to claim 1, wherein the alloy further contains, by mass, at least one of
V: not more than 1.0%,
Cu: not more than 0.5%, and
Nb: not more than 0.3%.

* * * * *